US010770386B2

(12) United States Patent
Iwai et al.

(10) Patent No.: US 10,770,386 B2
(45) Date of Patent: Sep. 8, 2020

(54) WIRING BOARD, ELECTRONIC DEVICE, AND WIRING BOARD MANUFACTURING METHOD

(71) Applicant: FUJITSU LIMITED, Kawasaki-shi, Kanagawa (JP)

(72) Inventors: Toshiki Iwai, Atsugi (JP); Daisuke Mizutani, Sagamihara (JP)

(73) Assignee: FUJITSU INTERCONNECT TECHNOLOGIES LIMITED, Nagano (JP)

( * ) Notice: Subject to any disclaimer, the term of this patent is extended or adjusted under 35 U.S.C. 154(b) by 0 days.

(21) Appl. No.: 16/124,730

(22) Filed: Sep. 7, 2018

(65) Prior Publication Data

US 2019/0013266 A1    Jan. 10, 2019

Related U.S. Application Data

(63) Continuation of application No. PCT/JP2017/012127, filed on Mar. 24, 2017.

(30) Foreign Application Priority Data

Mar. 28, 2016    (JP) .................................. 2016-063825

(51) Int. Cl.
*H01L 23/498* (2006.01)
*H05K 3/28* (2006.01)
(Continued)

(52) U.S. Cl.
CPC .... *H01L 23/49838* (2013.01); *H01L 21/4857* (2013.01); *H01L 23/49811* (2013.01);
(Continued)

(58) Field of Classification Search
None
See application file for complete search history.

(56) References Cited

U.S. PATENT DOCUMENTS 6,461,953 B1    10/2002  Sakuyama et al.
2003/0000734 A1  1/2003  Nakagawa
(Continued)

FOREIGN PATENT DOCUMENTS

CN         1656612 A     8/2005
CN       101047159 A    10/2007
(Continued)

OTHER PUBLICATIONS

Japanese Office Action dated Jul. 2, 2019 for corresponding Japanese Patent Application No. 2016-063825, with English Translation, 10 pages. *Please note JP-2005-217054-A, JP-11-191670-A and JP-2000-200855-A cited herewith, were previously cited in an IDS filed on Sep. 7, 2018.*

(Continued)

*Primary Examiner* — Steven M Christopher
(74) *Attorney, Agent, or Firm* — Westerman, Hattori, Daniels & Adrian, LLP

(57) ABSTRACT

A wiring board includes: an insulating layer that includes a first surface over which an electronic component is mounted and a second surface opposite to the first surface; a conductive layer that is disposed on the second surface; a via that is provided inside a first through-hole that penetrates a portion between the first surface and the second surface of the insulating layer; an electrode that is disposed on the first surface and connected to the via; and a glass plate that is not contact with the conductive layer and is disposed on the first surface and includes a second through-hole through which the electrode is disposed.

7 Claims, 6 Drawing Sheets

(51) Int. Cl.
  *H01L 21/48* (2006.01)
  *H01L 23/00* (2006.01)
  *H05K 1/11* (2006.01)
  *H05K 1/02* (2006.01)
  *H05K 3/34* (2006.01)

(52) U.S. Cl.
  CPC ........ *H01L 23/49822* (2013.01); *H01L 24/16* (2013.01); *H05K 3/28* (2013.01); *H01L 21/486* (2013.01); *H01L 23/49816* (2013.01); *H01L 23/49827* (2013.01); *H01L 24/81* (2013.01); *H01L 2224/13147* (2013.01); *H01L 2224/13611* (2013.01); *H01L 2224/13655* (2013.01); *H01L 2224/16227* (2013.01); *H01L 2224/16235* (2013.01); *H01L 2224/16238* (2013.01); *H01L 2224/81192* (2013.01); *H01L 2224/81815* (2013.01); *H05K 1/0298* (2013.01); *H05K 1/115* (2013.01); *H05K 3/3436* (2013.01); *H05K 2201/0175* (2013.01); *H05K 2203/041* (2013.01)

(56) References Cited

U.S. PATENT DOCUMENTS

| | | | |
|---|---|---|---|
| 2005/0009315 A1 | 1/2005 | Kim et al. | |
| 2006/0102384 A1* | 5/2006 | Watanabe | H01L 23/49816 174/256 |
| 2007/0166520 A1* | 7/2007 | Leib | C03C 4/12 428/209 |
| 2007/0221400 A1 | 9/2007 | Kurashina et al. | |
| 2014/0003009 A1* | 1/2014 | Ma | H01L 21/486 361/757 |
| 2015/0068791 A1 | 3/2015 | Nakamura | |

FOREIGN PATENT DOCUMENTS

| | | |
|---|---|---|
| CN | 101129102 A | 2/2008 |
| JP | 6-283846 | 10/1994 |
| JP | 11-191670 | 7/1999 |
| JP | 2000-200855 | 7/2000 |
| JP | 2003-17819 A | 1/2003 |
| JP | 2004-255562 A | 9/2004 |
| JP | 2005-217054 | 8/2005 |
| JP | 2007-266136 | 10/2007 |
| JP | 2015-56561 A | 3/2015 |
| WO | 00/10369 | 2/2000 |

OTHER PUBLICATIONS

Japanese Office Action dated Jan. 14, 2020 for corresponding Japanese Patent Application No. 2016-063825, with English Translation, 8 pages. *Please note JP-2005-217054-A, WO00/10369-A1, JP-11-191670-A and JP-2000-200855-A cited herewith, were previously cited in an IDS filed on Sep. 7, 2018.*.
International Search Report, mailed in connection with PCT/JP2017/012127 and dated May 16, 2017 (13 pages).
Written Opinion of the International Searching Authority, mailed in connection with PCT/JP2017/012127 and dated May 16, 2017, with partial English translation (12 pages).
Office Action dated Jul. 1, 2020, issued in counterpart CN Application No. 201780018829.6, with English translation (28 pages).

* cited by examiner

WIRING BOARD, ELECTRONIC DEVICE, AND WIRING BOARD MANUFACTURING METHOD

CROSS-REFERENCE TO RELATED APPLICATION

This application is a continuation application of International Application PCT/JP2017/012127 filed on Mar. 24, 2017 and designated the U.S., the entire contents of which are incorporated herein by reference. The International Application PCT/JP2017/012127 is based upon and claims the benefit of priority of the prior Japanese Patent Application No. 2016-063825, filed on Mar. 28, 2016, the entire contents of which are incorporated herein by reference.

FIELD

The embodiment discussed herein is related to a wiring board, an electronic device, and a manufacturing method of a wiring board.

BACKGROUND

In the related art, there is a multilayer wiring board including a resin lamination body in which a plurality of buildup layers implemented each of insulating layers and wiring patterns are laminated, and the first and second solder resist layers formed on the upper surface and lower surface of the resin lamination body, in which the first and second solder resist layers include a glass cloth (for example, see Japanese Laid-open Patent Publication No. 2007-266136).

However, when a glass cloth is included in a solder resist layer to reinforce the wiring board, irregularities are formed on a surface of the solder resist layer between a portion where the glass cloth is present and a portion where the glass cloth is not present, and it may be hard to connect an electrode (pad) of the wiring board to a terminal of the electronic component to a terminal of an electronic component mounted on the wiring board.

In such a case, the wiring board and the electronic component may not be electrically connected, and reliability is lowered.

SUMMARY

According to an aspect of the embodiments, a wiring board comprising: an insulating layer that includes a first surface over which an electronic component is mounted and a second surface opposite to the first surface; a conductive layer that is disposed on the second surface; a via that is provided inside a first through-hole that penetrates a portion between the first surface and the second surface of the insulating layer; an electrode that is disposed on the first surface and connected to the via; and a glass plate that is disposed on the first surface and includes a second through-hole through which the electrode is disposed.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

When a glass cloth is included in a solder resist layer to reinforce the wiring board, irregularities are formed on a surface of the solder resist layer between a portion where the glass cloth is present and a portion where the glass cloth is not present, and it may be hard to connect an electrode (pad) of the wiring board to a terminal of the electronic component to a terminal of an electronic component mounted on the wiring board.

In such a case, the wiring board and the electronic component may not be electrically connected, and reliability is lowered.

Hereinafter, an embodiment to which a wiring board, an electronic device, and a manufacturing method of the wiring board are applied will be described.

Embodiment

Figure 1:
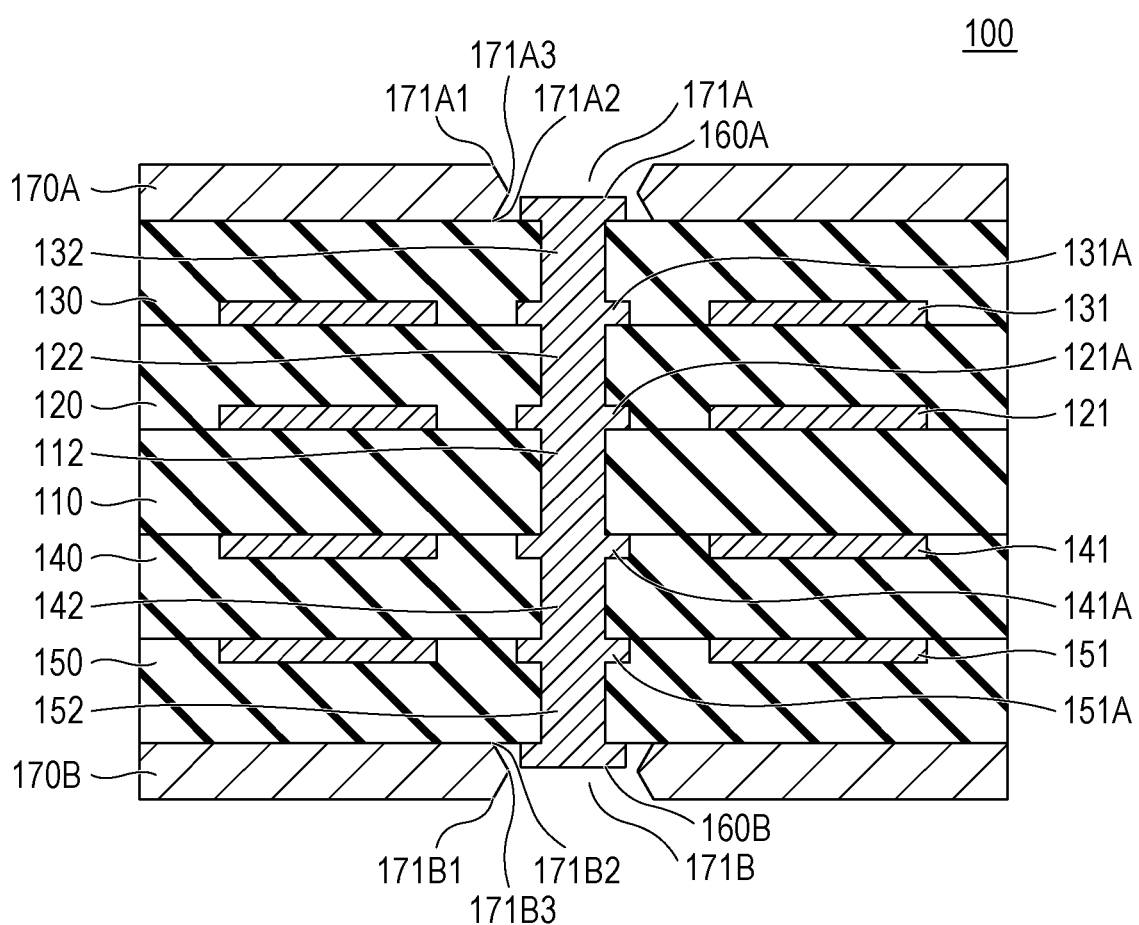
FIG. 1 is a diagram illustrating a sectional structure of a wiring board of an embodiment.

FIG. 1 is a diagram illustrating a sectional structure of a wiring board 100 of an embodiment.

The wiring board 100 includes insulating layers 110, 120, 130, 140, and 150, wiring layers 121, 131, 141, and 151, lands 121A, 131A, 141A, and 151A, vias 112, 122, 132, 142, and 152, pads 160A and 160B, and glass plates 170A and 170B.

The wiring board 100 is a multilayer board including a plurality of layers, and it is referred to the level of the pad 160A as an L1 layer, the level of the wiring layer 131 as an L2 layer, the level of the wiring layer 121 as an L3 layer, the level of the wiring layer 141 as an L4 layer, the level of the wiring layer 151 as an L5 layer, and the level of the pad 160B as an L6 layer. That is, the wiring board 100 is a six-layer board.

Hereinafter, for the convenience of explanation, it is referred to as upper or lower by using a vertical relationship in FIG. 1. However, this does not indicate a universal hierarchical relationship. In addition, the thickness of each configuration element indicates a thickness in a vertical direction in FIG. 1. In addition, a planar view means to see the wiring board 100 indicating a sectional structure in FIG. 1 directly above or from directly below. In addition, in a case where a position in the thickness direction of the wiring board 100 is indicated, a word referred to as a level is used.

For example, in the insulating layers 110, 120, 130, 140, and 150, the insulating layer 130 is a core, and the insulating layers 110, 120, 140, and 150 are prepregs. For example, the core is an example of the insulating layer, and copper foils (wiring layers 121 and 141) adhered to both sides by impregnating a glass cloth board in an epoxy resin.

The prepreg is an example of the insulating layer, and an example of an adhesion layer. For example, as the prepreg, so-called B-stage (semi-cured state) is used. For example, the prepreg is obtained by impregnating a woven fabric such as glass fiber and carbon fiber or a nonwoven fabric with an insulating resin such as epoxy and polyimide. The insulating resin is preferably a thermosetting resin.

Here, as an example, the wiring layers 121, 131, 141, and 151 are obtained by patterning copper foils of the L3 layer, the L2 layer, the L4 layer, and the L5 layer into shapes of a predetermined wiring and the like. As illustrated in FIG. 1, the wiring layers 121, 131, 141, and 151 are alternately superimposed and pressurized with the insulating layers 110, 120, 130, 140, 150 through heating. The wiring layers 121, 131, 141, and 151 are examples of a conductive layer.

The lands 121A, 131A, 141A, and 151A are positioned at the same levels as those of the wiring layers 121, 131, 141, and 151, respectively. The lands 121A, 131A, 141A, and 151A are obtained by patterning the copper foils of the L3 layer, the L2 layer, the L4 layer, and the L5 layer into an annular ring shape, similar to the wiring layers 121, 131, 141, and 151.

The lands 121A, 131A, 141A, and 151A are positioned above or below the vias 112, 122, 132, 142, and 152, and are arranged to surround the vias 112, 122, 132, 142, and 152 in the planar view.

Here, as an example, a case where the wiring layers 121, 131, 141, and 151 and the lands 121A, 131A, 141A, and 151A are copper foils are described, but the wiring layers may be a metal containing any one of copper (Cu), nickel (Ni), gold (Au), silver (Ag) and bismuth (Bi).

The vias 112, 122, 132, 142, and 152 are columnar connection portions formed inside through-holes (via holes) penetrating the insulating layers 110, 120, 130, 140, and 150 in the thickness direction. Through holes (via holes) penetrating the insulating layers 110, 120, 130, 140, and 150 in the thickness direction are examples of a first through-hole.

For example, the via hole may be formed by a laser process and the vias 112, 122, 132, 142, and 152 may be formed by a plating process. In metals (vias 112, 122, 132, 142, and 152) formed by the plating process, the metal such as copper (Cu), nickel (Ni), and gold (Au) can be used.

The pads 160A and 160B are arranged to be connected to an upper end of the via 132 and a lower end of the via 152, respectively. The shape of the pads 160A and 160B is circular in the planar view. The pads 160A and 160B are connected to a terminal on the lower surface of an IC chip via a solder ball or the like, when an electronic component such as an IC (integrated circuit) chip is mounted to the wiring board 100.

The pads 160A and 160B are examples of an electrode. As an example, the diameter of the pads 160A and 160B 160 μm. The size (diameter) of the pads 160A and 160B is set to a size not in contact with the glass plates 170A and 170B in the thermal expansion of a metal of a temperature (as example, 200° C.) when heating and pressurizing by the press machine.

The pads 160A and 160B may be made of a metal including at least one of copper (Cu), nickel (Ni), gold (Au), silver (Ag), aluminum (Al), titanium (Ti), tin (Sn), and bismuth (Bi).

The glass plates 170A and 170B are arranged on a surface of an upper side surface and a lower side surface of the wiring board 100, respectively. Each of the glass plates 170A and 170B is pressurized on the insulating layers 130 and 150 through heating, and provided instead of the solder resist in a wiring board of the related art. Therefore, the wiring board 100 does not include the solder resist.

Each of the glass plates 170A and 170B includes the through-holes 171A and 171B. The through-holes 171A and 171B are provided in accordance with positions of the pads 160A and 160B in the planar view. The through-holes 171A and 171B are examples of a second through-hole.

It is preferable that the glass plates 170A and 170B use a material including any one of aluminum oxide ($Al_2O_3$) or silicon dioxide ($SiO_2$). In addition, as an example, the thicknesses of the glass plates 170A and 170B are equal to or greater than 10 μm to equal to or lower than 100 μm, and, here, it is assumed that the thickness is 50 μm.

A through-hole 171A is opened as a circular shape in the planar view. The inner wall of the glass plate 170A in contact with the through-hole 171A protrudes on an inner side of the through-hole 171A between the upper end 171A1 and the lower end 171A2, as compared to the upper end 171A1 and the lower end 171A2 in a sectional view.

In this manner, a portion protruding on an inner side of the through-hole 171A constitutes the convex portion 170A3. That is, the through-hole 171A includes the convex portion 170A3.

The convex portion 170A3 protrudes on the inner side of the through-hole 171A in a tapered shape, and is formed in the annular ring shape in the planar view. The convex portion 170A3 is a tapered portion in the annular ring shape which protrudes on the inner side of the through-hole 171A.

For example, the through-hole 171A including a convex portion 171A3 can be formed by irradiating laser from the upper side and the lower side of the glass plate 170A, before the glass plate 170A is overlapped with the insulating layer 130.

The opening diameter in a portion of the convex portion 171A3 of the through-hole 171A is equal to or greater than that of the diameter of the pad 160A. Here, as an example, the opening diameter of the through-hole 171A in the upper end 171A1 and the lower end 171A2 is 180 μm and the opening diameter of the through-hole 171A in the convex portion 171A3 is 160 μm.

It is preferable that difference between the opening diameter of the through-hole 171A in the upper end 171A1 and the lower end 171A2 and the opening diameter of the through-hole 171A in the convex portion 171A3 is set greater than 0 μm, and set equal to or lower than the thicknesses of the glass plates 170A and 170B (here, 50 μm).

The opening diameter in a portion of the convex portion 171A3 of the through-hole 171A is set equal to or greater than the diameter of the pad 160A. The reason for setting such a convex portion 171A3 will be described below.

The through-hole 171B includes the same configuration as that of the through-hole 171A. That is, the through-hole 171B is opened in the circular shape in the planar view. On an inner wall of the glass plate 170B in contact with the through-hole 171B, the convex portion 171B3 protruding on an inner side of the through-hole 171B from an upper end 171B1 and a lower end 171B2 is provided in the sectional view.

The convex portion 170B3 protrudes in the tapered shape on an inner side of the through-hole 171B, and is formed in the annular ring shape in the planar view. The convex portion 170B3 is a tapered portion in the annular ring shape which protrudes on an inner side of the through-hole 171B in the tapered shape.

For example, the through-hole 171B including the convex portion 171B3 can be formed by irradiating the laser from an upper side and a lower side of the glass plate 170B, before the glass plate 170B is overlapped with the insulating layer 130.

The opening diameter in a portion of the convex portion 171B3 of the through-hole 171B is equal to or greater than the diameter of the pad 160B. Here, as an example, the opening diameter of the through-hole 171B in the upper end 171B1 and the lower end 171B2 is 180 μm, and the opening diameter of the through-hole 171B in the convex portion 171B3 is 160 μm.

It is preferable that the difference between the opening diameter of the through-hole 171B in the upper end 171B1 and the lower end 171B2 and the opening diameter of the through-hole 171B in the convex portion 171B3 is set greater than 0 μm, and set equal to or lower than the thicknesses of the glass plates 170B and 170B (here, 50 μm).

the opening diameter in a portion of the convex portion 171B3 of the through-hole 171B is set greater than the diameter of the pad 160B. The reason for providing such a convex portion 171B3 will be described below.

Figure 2:
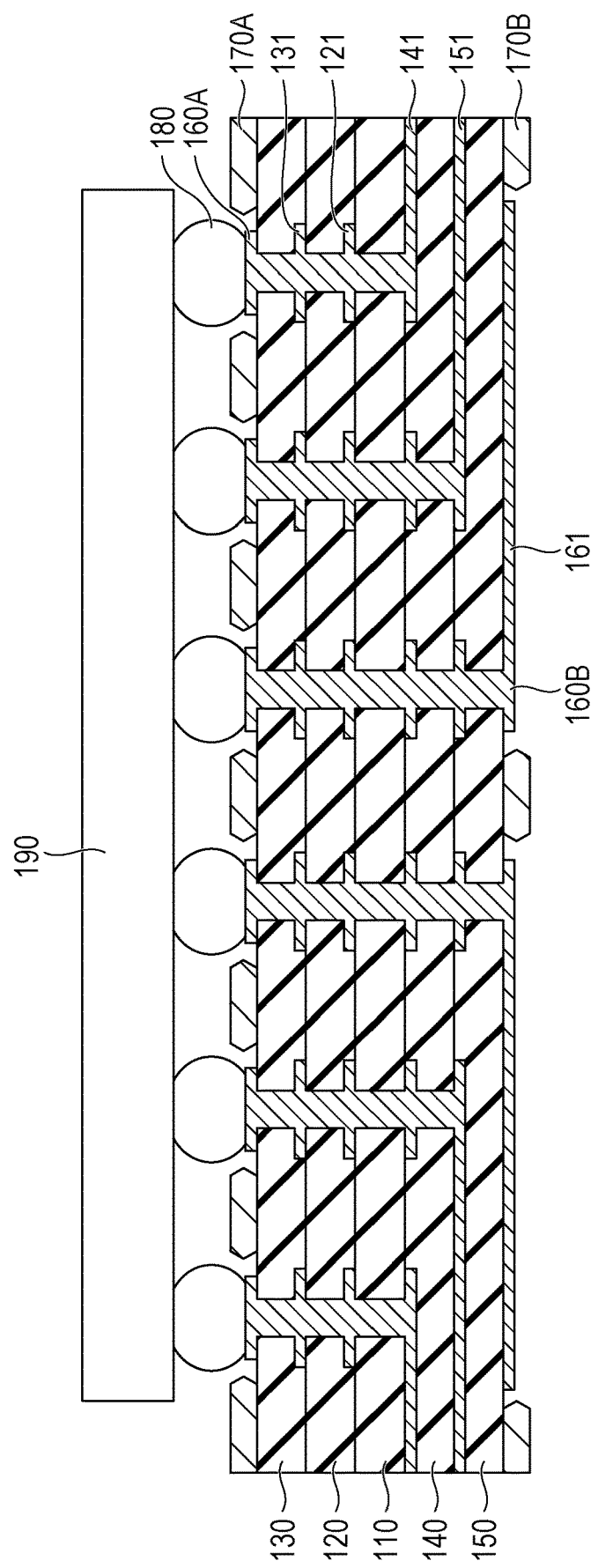
FIG. 2 is a diagram illustrating a state in which an IC chip is mounted on the wiring board.

FIG. 2 is a diagram illustrating a state where an IC chip 190 is mounted on the wiring board 100. In FIG. 2, a range in which six pads 160A and two pads 160B are present, is illustrated. Therefore, for the convenience of explanation, a configuration of the wiring layers 121, 131, 141, and 151, and the like of the wiring board 100 illustrated in FIG. 1 is slightly changed and the wiring layer 161 is provided on the L6 layer of the wiring board 100.

A terminal of the IC chip 190 is connected to the pad 160A via a solder ball 180. The IC chip 190 mounted on the wiring board 100 in a so-called flip chip bonding method. The mounting of the IC chip 190 is realized by connecting a terminal of the IC chip 190 and by melting the solder balls 180 arranged on the pad 160A through a so-called reflow process.

For example, the solder ball 180 is formed by a plating layer such as nickel and tin around a core ball made of copper. In addition, here, as an example of the electronic components, a case where the IC chip 190 is mounted, is described, but an electronic component such as a memory chip and a capacitor may be used instead of the IC chip 190.

Next, by using FIG. 3 to FIG. 7, a manufacturing method of the wiring board 100 will be described.

FIG. 3 to FIG. 7 are diagrams illustrating a manufacturing process of the wiring board 100.

Figure 3:
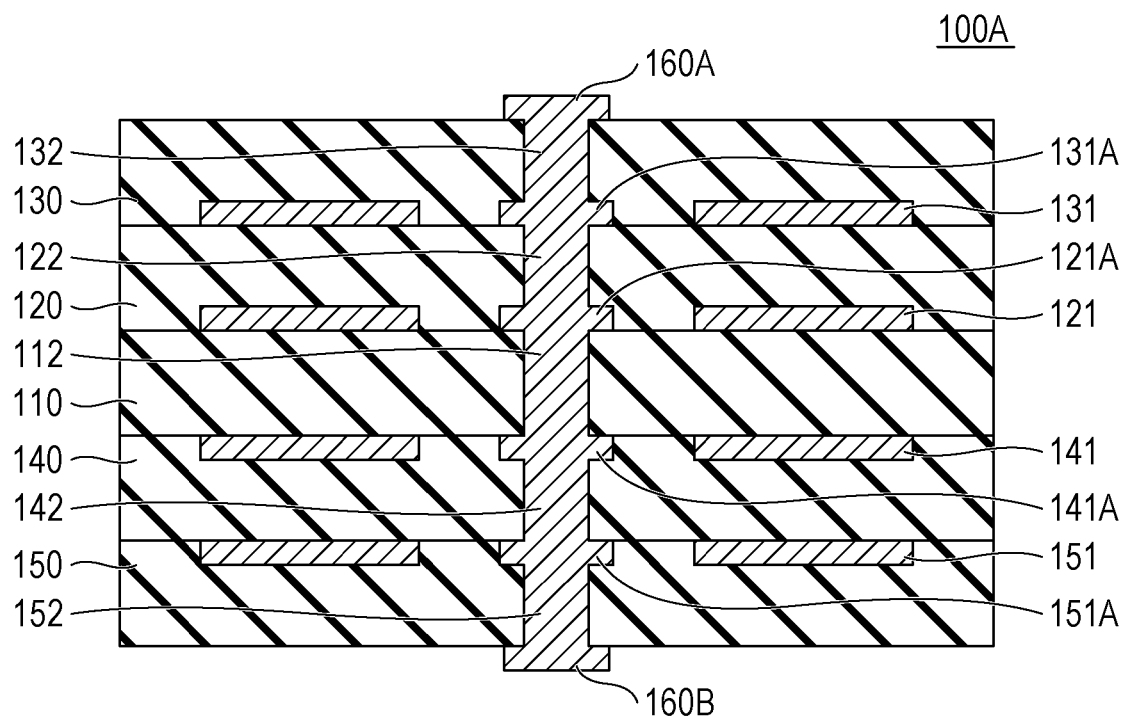
FIG. 3 is a diagram illustrating a manufacturing process of the wiring board.

First, as illustrated in FIG. 3, a structure body 100A in which the insulating layers 110, 120, 130, 140, and 150, the wiring layers 121, 131, 141, and 151 are overlapped in a state where thermal fusion is not performed, is prepared. In the structure body 100A, the lands 121A, 131A, 141A, and 151A, the vias 112, 122, 132, 142, and 152, and the pads 160A and 160B are formed.

Next, the laser process is performed on an upper surface of the glass plate 170A of thickness 50 μm and the through-hole 171C is formed. For example, when manufacturing by using a CO2 laser, a truncated cone shape hole can be formed. In this process, as an example, the through-hole 171C of a truncated cone shape in which the opening diameter of an upper side the end portion 171C1 is 180 μm and the opening diameter of a lower side end portion 171C2 is 120 μm, is formed.

Figure 4:
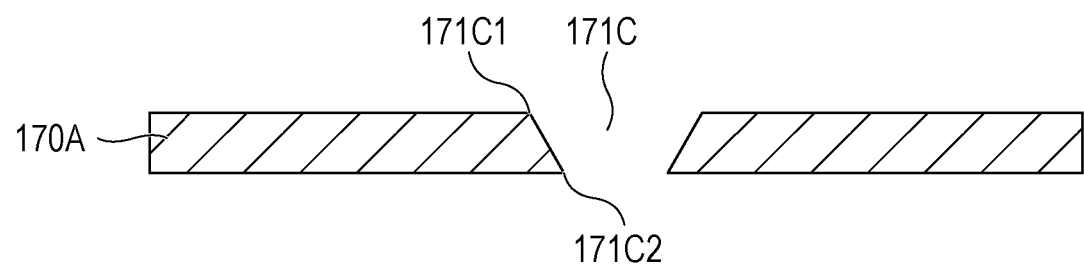
FIG. 4 is a diagram illustrating another manufacturing process of the wiring board.

In this manner, as illustrated in FIG. 4, it is possible to form the through-hole 171C having a smaller opening diameter at an end portion 171C2 than an end portion 171C1. The end portion 171C2 positioned on a lower side in FIG. 4 may cause to form a small opening (here, opening of 120 μm) on a lower surface of the glass plate 170A.

The size of a truncated cone of the through-hole 171C is set such that the opening diameter of the end portion 171C1 is 180 μm and the opening diameter of the end portion 171C2 is 120 μm. This is to make the pad 160A and the glass plate 170A not in contact with each other in the next process (FIG. 5).

The same process is also performed with respect to the glass plate 170B. In addition, an excimer laser, a YAG laser, a UV laser, and an etching process instead of the $CO_2$ laser may be used.

Figure 5:
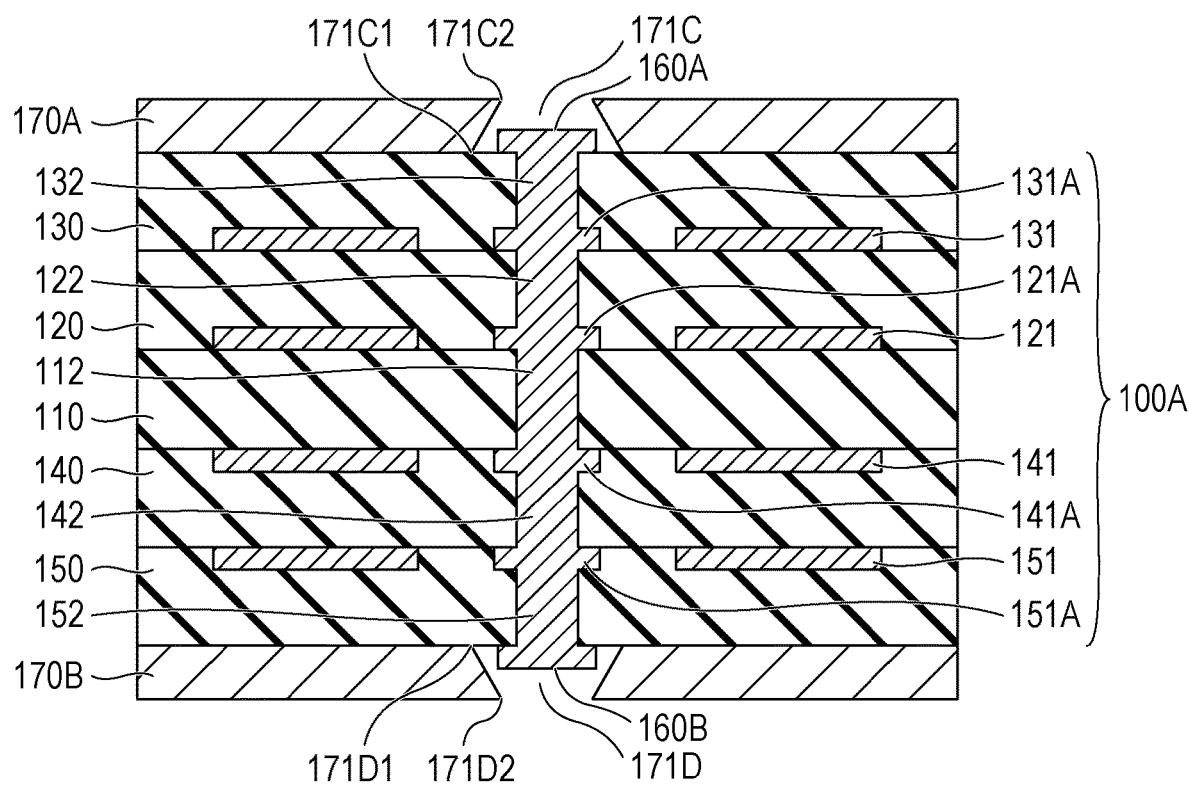
FIG. 5 is a diagram illustrating still another manufacturing process of the wiring board.

Next, as illustrated in FIG. 5, by inverting (inverted upside down) the top and bottom of the glass plate 170A illustrated in FIG. 4 and the top and bottom are overlapped on the structure body 100A. In addition, the glass plate 170B in which the through-hole 171D the same as the through-hole 171C of the glass plate 170A is formed, is overlapped under the structure body 100A.

At this time, in the through-holes 171C and 171D, the end portions 171C1 and 171D1 side having a large opening are positioned closer to the pads 160A and 160B, and the sizes of the through-holes 171C and 171D are set such that the glass plates 170A and 170B are not in contact with the pads 160A and 160B. Therefore, the glass plates 170A and 170B are not damaged.

Figure 6:
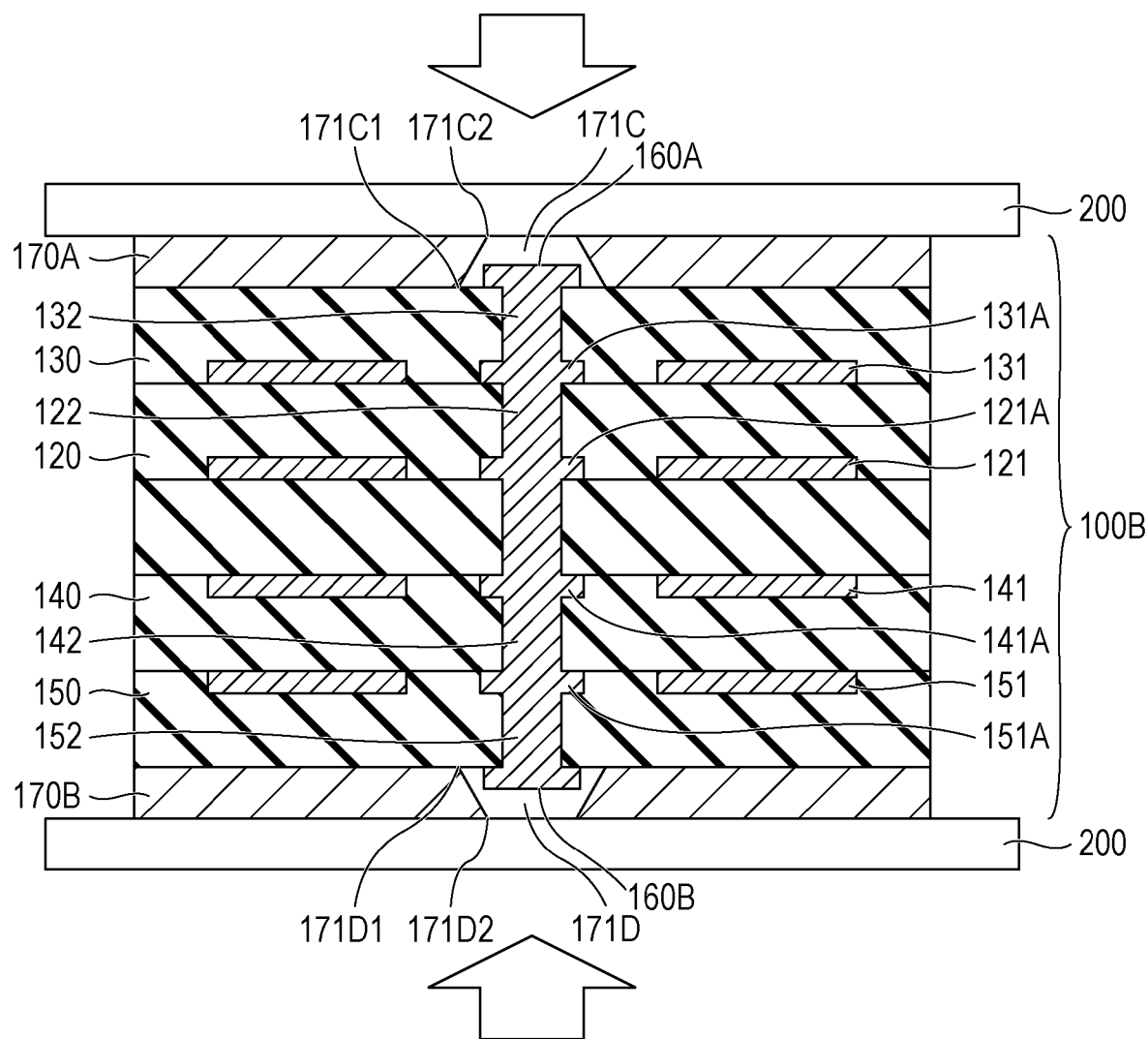
FIG. 6 is a diagram illustrating further still another manufacturing process of the wiring board.

Next, as illustrated in FIG. 5, the glass plate 170A, the structure body 100A, and the glass plate 170B in an overlapped state are arranged in the press machine 200 as illustrated in FIG. 6, and the thermal fusion is performed by applying pressure while heating. As an example, a heating temperature is 200° C. and a heating time is 90 minutes.

By this process, the insulating layers 110, 120, 130, 140, and 150, the wiring layers 121, 131, 141, and 151, and the lands 121A, 131A, 141A, and 151A are thermally fused, and the glass plates 170A and 170B are thermally fused with the insulating layers 130 and 150.

Next, a structure body 100B obtained by the thermal fusion is taken out from the press machine 200, the laser process is performed from the upper side of the through-hole 171C, and the laser process is further performed from the lower side of the through-hole 171D. In a case where the laser process is performed from the lower side of the through-hole 171D, the top and bottom of the structure body 100B may be inverted.

Figure 7:
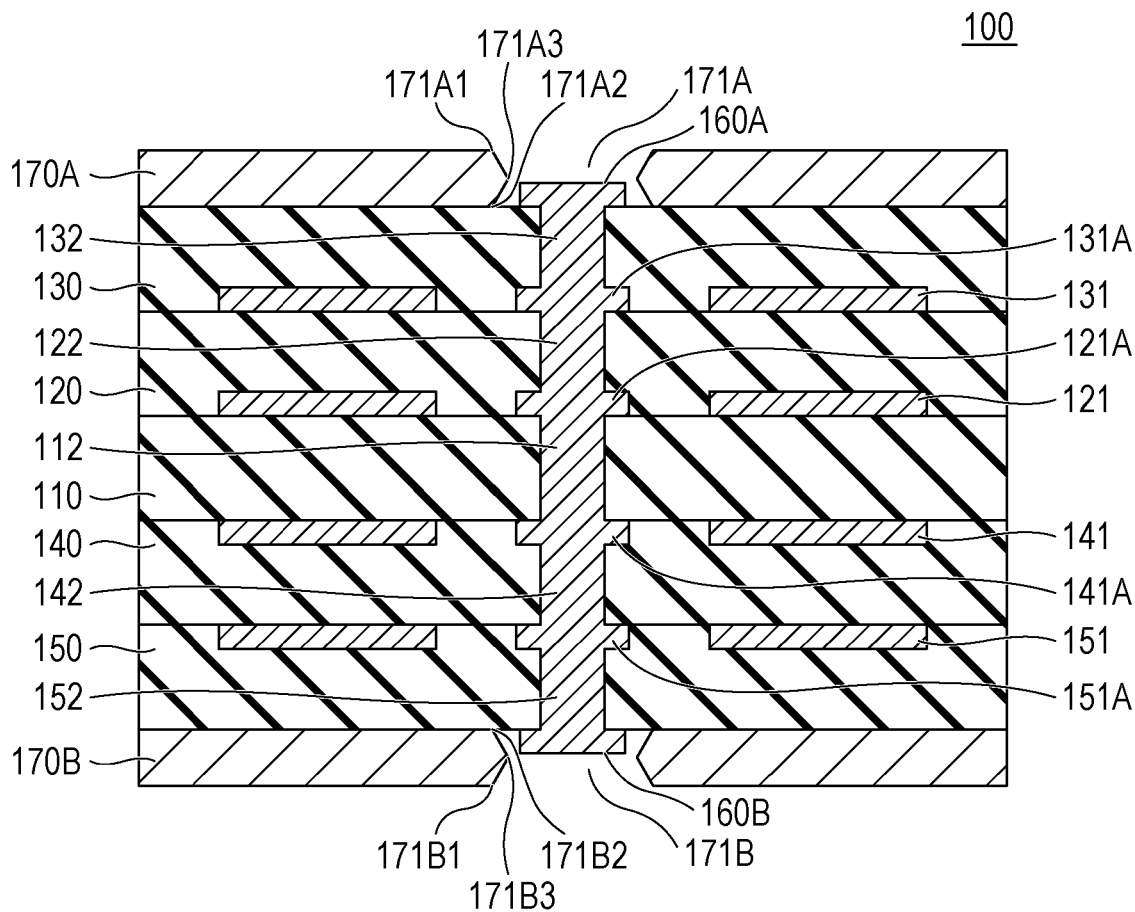
FIG. 7 is a diagram illustrating further still another manufacturing process of the wiring board.

The laser process may be performed to the same depth as that in the laser process illustrated in FIG. 4. In this manner, the through-holes 171A and 171B protruding on the inside can be formed by the convex portions 171A3 and 171B3 and the wiring board 100 can be obtained as illustrated in FIG. 7.

As described above, according to the embodiment, the wiring board 100 in which the glass plates 170A and 170B are provided on the upper surface of the insulating layer 130 and the lower surface of the insulating layer 150, respectively, is obtained.

The IC chip 190 is formed of silicon or the like, but the insulating layers 110, 120, 130, 140, and 150 are the core or the prepreg, and thermal expansion coefficients of the insulating layers 110, 120, 130, 140, and 150 are larger than that of the IC chip 190.

On the wiring board 100, in consideration of the difference between the thermal expansion coefficient the IC chip 190 and the insulating layers 110, 120, 130, 140, and 150 when the IC chip 190 is operated and heated, the glass plates 170A and 170B are provided. The thermal expansion coefficients of the glass plates 170A and 170B are values considerably close to the thermal expansion coefficient of the IC chip 190.

Therefore, even if the IC chip 190 is operated and heated, it is possible to suppress distortion of the insulating layers 110, 120, 130, 140, and 150 on the glass plates 170A and 170B, and it is possible to stably maintain a connection state between a terminal of the IC chip 190 connected via the solder ball 180 and the pads 160A and 160B.

Accordingly, by reinforcing the insulating layers 110, 120, 130, 140, 150, and the like in the glass plates 170A and 170B, it is possible to provide the wiring board 100 with high reliability.

In addition, since the surface of the glass plate 170A is flat, it is possible to approximately maintain fixed distances between a plurality of pads 160A and a plurality of terminals on the lower surface of the IC chip 190. Therefore, it is possible to reliably connect the plurality of pads 160A and the plurality of terminals on the lower surface of the IC chip 190 by the solder ball 180, and it is possible to suppress occurrence of the connection failure of the solder ball 180.

In the wiring board of the related art, since the glass cloth is mixed in a solder resist layer, there is a possibility that irregularities occur on a surface of the solder resist layer, and one pad and the terminal in the plurality of pads of the wiring board and the plurality of terminals on the lower surface of the electronic components, may not be connected to each other by the solder ball.

On the other hand, in the wiring board 100, since the occurrence of such a situation can be suppressed, the reliability can be improved.

In addition, in the process of manufacturing the wiring board 100, as illustrated in FIG. 5, the end portions 171C1 and 171D1 having a large opening of the through-holes 171C and 171D are positioned closer to the pads 160A and 160B, and the structure body 100A and the glass plates 170A and 170B are pressurized by the press machine 200 through heating.

The size of the through-holes 171C and 171D is set such that the pads 160A and 160B are not in contact with the glass plates 170A and 170B, even if heating and pressurizing are performed by the press machine 200 as illustrated in FIG. 6, the glass plates 170A and 170B are not damaged.

Therefore, in the manufacturing process, it is possible to suppress the pads 160A and 160B from interfering with the glass plates 170A and 170B, and it is possible to suppress damage such as cracking and chipping of the glass plates 170A and 170B.

In addition, when performing the heating and pressurizing, since the end portions 171C2 and 171D2 having small openings of the through-holes 171C and 171D are positioned at a side far from the pads 160A and 160B, it is possible to suppress the insulating layers 130 and 150 (prepreg) before hardening in a half-life condition from being leaked out of the through-holes 171C and 171D from the end portions 171C2 and 171D2.

In this process, even if prepregs of the insulating layers 130 and 150 enter the through-holes 171C and 171D and cover surfaces of the pads 160A and 160B, since the prepreg can be removed when the through-holes 171A and 171B are formed by performing the laser process on the upper side of the through-hole 171C and the lower side of the through-hole 171D, the prepreg does not remain on the surfaces of the pads 160A and 160B.

Since it is suppressed that the insulating layers 130 and 150 (prepreg) is leaked out of the through-holes 171C and 171D, the upper surface of the glass plate 170A and the lower surface of the glass plate 170B are maintained in a flat state, and it is possible to suppress connection failure of the solder ball 180 and it is possible to provide the wiring board 100 with high reliability.

In addition, the wiring board 100 includes the through-hole 171A formed so as to avoid the pad 160A of the L1 layer. The diameter of the through-hole 171A is set to be equal to or larger than the diameter of the pad 160A even in a portion of the smallest convex portion 171A3.

Therefore, by optimizing the opening diameter of the convex portion 171A3, the diameter of the pad 160A, and positional relationship between the convex portion 171A3 and the pad 160A in a thickness direction of the glass plate 170A, it is possible to secure a space for installing the solder ball 180 of an optimum size on the pad 160A.

Figure 8:
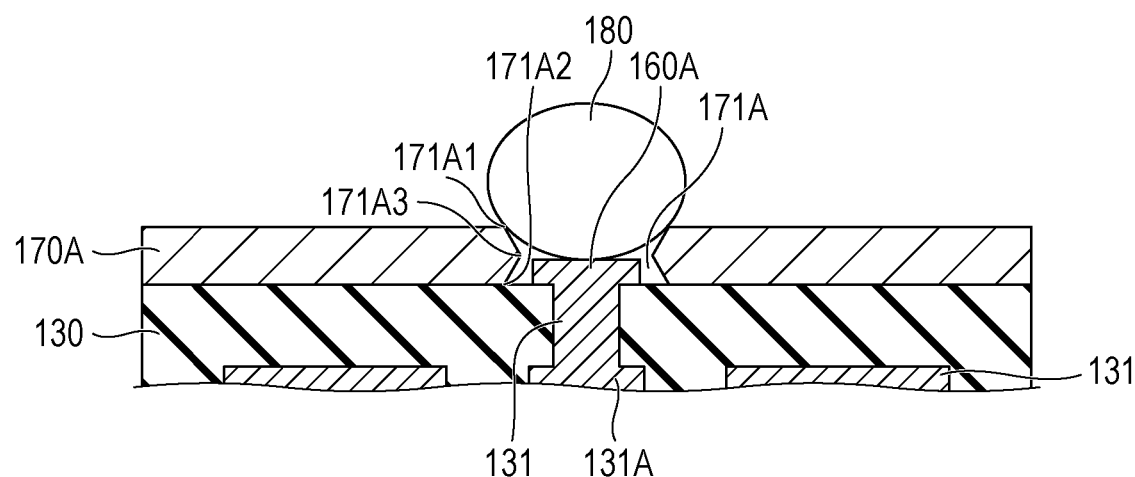
FIG. 8 is a diagram illustrating a state in which a solder ball is mounted.

FIG. 8 is a diagram illustrating a state where the solder ball 180 is mounted. Optimizing the size of the solder ball 180 is very important in ensuring the connection between the pad 160A and a terminal of the IC chip 190.

For example, as illustrated in FIG. 8, in a state where the bottom of the solder ball 180 is in contact with the pad 160A, the solder ball 180 may be secured at a surface (surface higher than that of concave portion of through-hole 171A) of the glass plate 170A between the convex portion 171A3 and the upper end 171A1.

The insulating layers 110, 120, 130, 140, and 150 may be made of glass.

In addition, the wiring board 100 may be a configuration including the through-holes 171C and 171D of the truncated cone shape without performing the laser process described by using FIG. 7.

In addition, in a case where demanded strength can be obtained only with the glass plate 170A, a configuration in which the wiring board 100 does not include the glass plate 170B, may be implemented. In this case, the solder resist may be applied on the lower surface of the insulating layer 150 instead of the glass plate 170B.

In addition, while manufacturing a structure body in which the insulating layers 110, 120, 130, 140, and 150, the wiring layers 121, 131, 141, and 151, and the lands 121A, 131A, 141A, and 151A are thermally fused, the glass plates 170A and 170B may be mounted on the insulating layers 130 and 150, respectively.

In addition, as described above, a case where the wiring board 100 includes the insulating layers 110, 120, 130, 140, and 150, the wiring layers 121, 131, 141, and 151, the pads 160A and 160B, the glass plates 170A and 170B, and the like, and includes layers from the L1 layer to the L6 layer, is described.

However, the wiring board 100 may be a case where the insulating layer 130, the wiring layer 131, the land 131A, the via 132, the pad 160A, and the glass plate 170A are included. In addition, the insulating layer 130 may be configured with the glass plate and a resin layer. More specifically, the glass plate may be used instead of the insulating layer 130, and the resin layer may be provided to cover the wiring layers 121, 131, 141, and 151 between the glass plates.

So far, although the wiring board, the electronic device, and the method of manufacturing the wiring board according to the exemplary embodiment of the present disclosure is described above, the present disclosure is not limited to the specifically disclosed embodiment, and various modifications and changes are possible without departing from the scope of the claims.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

APPENDIX

1. A wiring board comprising: an insulating layer that includes a first surface to which an electronic component is mounted and a second surface opposite to the first surface; a conductive layer that is disposed on the second surface; a via that is provided inside a first through-hole that penetrates a portion between the first surface and the second surface of the insulating layer; an electrode that is disposed on the first surface and connected to the via; and a glass plate that is disposed on the first surface and includes a second through-hole through which the electrode is disposed.

2. The wiring board according to appendix 1, wherein the electrode is smaller than an opening of the second through-hole in a planar view.

3. The wiring board according to appendix 1, wherein the second through-hole includes an annular convex portion protruding in a tapered shape on an inner side of the opening along the opening so as to be the opening diameter smaller than those of the first opening and the second opening between a first opening in the first surface and a second opening in the second surface.

4. The wiring board according to appendix 1, wherein the second through-hole has a truncated cone shape in which the first opening in the first surface is greater than the second opening in the second surface or the first opening in the first surface is smaller than the second opening in the second surface between the first surface and the second surface.

5. The wiring board according to appendix 1, wherein a glass plate is used in a part of the insulating layer.

6. An electronic device comprising: a wiring board; and an electronic component that is mounted to the wiring board, wherein the wiring board includes an insulating layer including a first surface to which the electronic component is mounted, and a second surface opposite to the first surface, a conductive layer that is disposed on the second surface, a via that is disposed inside a first through-hole penetrating a portion between the first surface and the second surface of the insulating layer, an electrode that is disposed on the first surface and connected to the via, and a glass plate that is disposed on the first surface and includes a second through-hole through which the electrode is disposed.

7. A manufacturing method of a wiring board, comprising: forming a via that is provided inside a first through-hole penetrating a portion between a first surface and a second surface of an insulating layer, and an electrode that is connected to the via by being disposed on the first surface, on the insulating layer including the first surface to which an electronic component is mounted and the second surface opposite to the first surface; forming a second through-hole corresponding to the electrode on a glass plate; overlapping the glass plate on the first surface of the insulating layer in accordance with a position so as to expose the electrode from the second through-hole; overlapping a conductive layer on the second surface of the insulating layer; and fusing the insulating layer, the glass plate, and the conductive layer by heating and pressurizing.

What is claimed is:

1. A wiring board comprising:
   a first insulating layer that includes a first surface over which an electronic component is mounted and a second surface opposite to the first surface;
   a conductive layer that is disposed on the second surface;
   a via that is provided inside a first through-hole that penetrates a portion between the first surface and the second surface of the insulating layer;
   an electrode that is disposed on the first surface and connected to the via; and
   a glass plate that is not in contact with the conductive layer or the electrode and is disposed on the first surface and includes a second through-hole through which the electrode is disposed.

2. The wiring board of claim 1, wherein the electrode is smaller than an opening of the second through-hole in a planar view.

3. The wiring board of claim 2, wherein the second through-hole includes an annular convex portion protruding in a tapered shape on an inner side of the opening along the opening so as to be an opening diameter smaller than those of the first through-hole and the second through-hole between a first opening in the first surface and a second opening in the second surface.

4. The wiring board of claim 1, wherein the second through-hole has a truncated cone shape in which a first opening in the first surface is greater than a second opening in the second surface or the first opening in the first surface is smaller than the second opening in the second surface between the first surface and the second surface.

5. An electronic device comprising:
   a wiring board; and
   an electronic component that is mounted over the wiring board,
   the wiring board includes
   a first insulating layer including a first surface over which the electronic component is mounted, and a second surface opposite to the first surface,
   a conductive layer that is disposed on the second surface,
   a via that is disposed inside a first through-hole penetrating a portion between the first surface and the second surface of the insulating layer,
   an electrode that is disposed on the first surface and connected to the via, and
   a glass plate that is not in contact with the conductive layer or the electrode and is disposed on the first surface and includes a second through-hole through which the electrode is disposed.

6. The wiring board of claim 1 wherein the conductive layer extends at least partially into a second insulating layer.

7. The electronic device of claim 5 wherein the conductive layer extends at least partially into a second insulating layer.

* * * * *